(12) United States Patent
Shimizu et al.

(10) Patent No.: US 6,927,952 B2
(45) Date of Patent: Aug. 9, 2005

(54) CPP GMR FREE LAYER HAVING FERROMAGNETIC LAYERS WITH PARALLEL MAGNETIZATION SEPARATED BY NON-MAGNETIC LAYER

(75) Inventors: Yutaka Shimizu, Kawaski (JP);
Hirotaka Oshima, Kawasaki (JP);
Keiichi Nagasaka, Kawasaki (JP);
Yoshihiko Seyama, Kawasaki (JP);
Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 154 days.

(21) Appl. No.: 10/114,767

(22) Filed: Apr. 3, 2002

(65) Prior Publication Data

US 2003/0090844 A1 May 15, 2003

(30) Foreign Application Priority Data

Nov. 12, 2001 (JP) ...................................... 2001-345651

(51) Int. Cl.$^7$ ................................................ G11B 5/39
(52) U.S. Cl. ................................ 360/324.12; 360/324.2
(58) Field of Search ..................................... 360/324.12

(56) References Cited

U.S. PATENT DOCUMENTS

| | | | |
|---|---|---|---|
| 5,408,377 A | * 4/1995 | Gurney et al. ......... | 360/324.12 |
| 5,668,688 A | 9/1997 | Dykes et al. | |
| 5,933,297 A | 8/1999 | Hoshiya et al. ............. | 360/113 |
| 6,154,349 A | 11/2000 | Kanai et al. ........... | 360/324.12 |
| 6,259,586 B1 | * 7/2001 | Gill ......................... | 360/324.2 |
| 6,275,363 B1 | * 8/2001 | Gill ......................... | 360/324.2 |
| 6,469,879 B1 | * 10/2002 | Redon et al. ............ | 360/324.2 |
| 6,473,275 B1 | * 10/2002 | Gill ......................... | 360/324.2 |
| 6,608,738 B2 | * 8/2003 | Sakakima et al. ..... | 360/324.12 |
| 6,633,461 B2 | * 10/2003 | Gill ........................ | 360/324.12 |
| 6,661,623 B1 | * 12/2003 | Tsuchiya et al. ....... | 360/324.12 |
| 6,693,776 B2 | * 2/2004 | Gill ........................ | 360/324.12 |
| 6,700,757 B2 | * 3/2004 | Pinarbasi ............... | 360/324.12 |
| 2001/0024346 A1 | 9/2001 | Terunuma et al. ....... | 360/324.1 |

* cited by examiner

*Primary Examiner*—Craig A. Renner
(74) *Attorney, Agent, or Firm*—Greer, Burns & Crain, LTD

(57) ABSTRACT

A magnetoresistive device includes a laminated film, and a mechanism for applying sense current in a direction of lamination in the laminated film, wherein the laminated film includes a first ferromagnetic layer having a substantially fixed direction of magnetization, a second ferromagnetic layer having a freely variable direction of magnetization according to an external magnetic field, the second ferromagnetic layer including a non-magnetic metal layer, and two or more ferromagnetic metal layers separated from each other by the non-magnetic metal layer in the direction of lamination, and a non-magnetic intermediate layer that separates the first and second ferromagnetic layer from each other.

21 Claims, 7 Drawing Sheets

CPP GMR FREE LAYER HAVING FERROMAGNETIC LAYERS WITH PARALLEL MAGNETIZATION SEPARATED BY NON-MAGNETIC LAYER

BACKGROUND OF THE INVENTION

The present invention relates generally to reproducing of a record carrier using magnetic means, and more particularly to a magnetoresistive device. The present invention is suitable, for example, for a read head for use with a hard disc drive (referred to as "HDD" hereinafter).

Available electronic information content has explosively increased with the recent rapid technology development, as in the Internet. Accordingly, smaller and larger-capacity magnetic recorders, typified by HDDs, have been increasingly demanded to store such a large amount of information. A surface recording density indicative of recordable information content per unit recording area is required to be higher to realize a smaller and larger-capacity HDD.

At present, the surface recording density improves at an annual rate of about 100%. The increased surface recording density accordingly reduces an area on a record carrier corresponding to one bit as a minimum unit of magnetic record data, and a signal magnetic field from the record carrier becomes weaker as a matter of course. A small and highly sensitive read head is required to faithfully read such a weak signal magnetic field with certainty.

The current surface recording density of 20–30 Mb/in$^2$ requires a magnetic sensor as a read head to use a spin-valve film that exhibits a Giant Magnetoresistive (referred to as "GMR" hereinafter) effect. The spin-valve film has a sandwich structure including two uncoupled ferromagnetic layers separated by a non-magnetic metal layer, wherein one of the ferromagnetic layers has a fixed direction of magnetization.

A fixed magnetization usually attaches an antiferromagnetic metal layer, typified by Fe—Mo alloy, to one of the ferromagnetic layers. According to this structure, when an external magnetic field is applied, a direction of magnetization of an unfixed ferromagnetic layer (or free layer) freely rotates and accords with a direction of the external magnetic field, generating a difference in angle relative to the direction of magnetization of the ferromagnetic layer (or pinned layer) having the fixed direction of magnetization. The spin dependent scattering of a conduction electron varies according to the difference in angle, and thus the electric resistance value changes. A state of an external magnetic field or a signal magnetic field from a magnetic record carrier is obtained by detecting a changed electric resistance value.

Currently available read heads having a spin-valve film are heads of a so-called Current in Plane (referred to as "CIP" hereinafter) configuration that applies the sense current parallel to laminated surfaces in the spin-valve film. With higher surface recording density, a read-head size should be reduced according to a reduced bit size. This is because a read head excessively large for a record bit size would simultaneously take in magnetic information from both a target record track and track(s) adjacent to the target record track, deteriorating resolution in a direction of the track's width. The surface recording density of the 100-Gb/in$^2$ class requires head's size in a width direction to be reduced down to about 0.1 μm. A head of the CIP configuration needs a reduced device's height with a decreased device's width. This is because a weak signal magnetic field would result in such a small influential depth of the signal magnetic field in a direction of the device's height that no magnetic reversal occurs and no magnetic resistance appears at an end of the spin-valve film distant from the record carrier, and this dead section deteriorates the sensor's sensitivity.

Therefore, the read head of the CIP configuration needs to reduce the device's width as well as the device's height with higher surface recording density, and device resistance itself seldom changes with an increase of the surface recording density. However, an application of the same sense current increases the current density for the smaller device height, possibly deteriorating the device due to migration, etc. Thus, the sense current should be small with an increase of the surface recording density or with a decrease of the device's height, and an available readout output becomes small in proportion to the decreased sense current.

On the other hand, there has been proposed a read head of a configuration that applies the sense current perpendicular to laminated surfaces in a read sensor film. This is called a head of a Current Perpendicular to Plane (referred to as "CPP" hereinafter) configuration from a direction of an application of the sense current. The GMR sensor using the CPP configuration may be called a CPP-GMR.

This configuration effectively draws out a scattering effect, as one of the factors for causing a change in magnetic resistance, dependent upon a spin direction of a conduction electron at an interface between magnetic and non-magnetic laminated layers, and improves a rate of change in magnetic resistance about twice as high as the CIP configuration. Therefore, this configuration is expected to realize an extremely sensitive read head. In addition, the device sectional area (device's width×device's height) through which the sense current flows is three to five times as large as CIP's sectional area (device's width×device's height). Moreover, the CIP configuration has different specific resistance for each metal layer in the laminated film and the current flows in such a layer as a Cu layer having small specific resistance. Therefore, if it is assumed that the maximum current density is the current density at the part where the most current flows, the film as a whole allows the sense current of only 40% of the permissible current density. Therefore, the CPP configuration may have a flow of the sense current 7–12 times as large as the CIP configuration. In addition, it is necessary to reduce the sense current value due to the reduced device sectional area with the higher surface recording density, but a readout output value becomes advantageously constant when a rate of change in resistance is constant since the device's resistance increases in inverse proportion to the device sectional area.

Hitherto, no suitable materials for a CPP-GMR sensor have been proposed which have a reduced hysteresis and sufficient control over magnetic domain as well as providing large changes in the magnetic resistance. Undesirably, the unstable reduction of hysterisis and control over the magnetic domain make unstable operations of a magnetic head to which the CPP-GMR sensor is applied, while unsatisfactory changes in magnetic resistance would lower an output from the magnetic head (or sensitivity).

Accordingly, the instant inventors have initially reviewed use of a multilayer GMR film as materials for CPP-GMR sensor, and determined that the multilayer GMR film is not so suitable because the multilayer GMR film has such a disadvantageous structure that it is difficult to reduce the hysteresis and to control the magnetic domain for stable operations of the magnetic read head, etc.

The instant inventors have then reviewed an application of a spin-valve film to the CPP structure as the CIP head.

Although a usual spin-valve film advantageously facilitates control over the magnetic domain, it does not disadvantageously provide large magnetoresistive changes. Thus, the usual spin-valve film is of low practical use.

BRIEF SUMMARY OF THE INVENTION

Accordingly, it is an exemplified object of the present invention to provide a magnetoresistive device that provides large magnetoresistive changes in a stable state, a read head having the same, and a drive using the read head.

In order to achieve the above object, a magnetoresistive device includes a laminated film, and a mechanism for applying sense current in a direction of lamination in the laminated film, wherein said laminated film includes a first ferromagnetic layer having a substantially fixed direction of magnetization, a second ferromagnetic layer having a freely variable direction of magnetization according to an external magnetic field, the second ferromagnetic layer including a non-magnetic metal layer, and two or more ferromagnetic metal layers separated from each other by the non-magnetic metal layer in the direction of lamination, and a non-magnetic intermediate layer that separates the first and second ferromagnetic layer from each other. This magnetoresistive device increases the number of interferences between the non-magnetic and magnetic layers in the second ferromagnetic layer. After devoting themselves to review the above problems, the instant inventors have discovered that an additional interference increases a spin dependent scattering effect of a conduction electron and thus enhances the magnetoresistive changes. In order to avoid a decrease of magnetoresistive change due to the current shunt, it is desirable to make as thin as possible each layer in the spin-valve film in the CIP configuration that applies the sense current parallel to a direction of lamination. On the other hand, in the CPP structure like the present invention, a shunt loss does not occur even when a metal layer of relatively small specific resistance is added, and consequently a thickness of each layer may be relatively freely set up.

These two or more ferromagnetic metal layers in the second ferromagnetic layer may have parallel directions of magnetization, thereby enhancing the spin dependent scattering effect of conduction electrons and thus increasing changes in magnetic resistance. If they have antiparallel directions of magnetization, low and high resistant interferences are formed simultaneously for each spin direction of a conduction electron, canceling out the spin dependent scattering effect and reducing a rate of change in magnetic resistance. In addition, such parallel directions of magnetization would facilitate control over magnetic domain and reduction of hysterisis.

The non-magnetic metal layer in the second ferromagnetic layer provides spin dependent scattering when laminated onto the ferromagnetic metal layer in the second ferromagnetic layer. Thereby, the magnetoresistance change may be enhanced. Such a metal layer is made, for example, of Cu, Ag, or Au.

The first ferromagnetic layer may be a laminated layer that includes, in this order, a ferromagnetic metal layer, a non-magnetic metal layer, and another ferromagnetic metal layer, wherein two ferromagnetic metal layers in the first ferromagnetic layer have antiparallel directions of magnetization via the non-magnetic metal layer in the first ferromagnetic layer. The first ferromagnetic layer has a synthetic ferri structure made, for example, of Co/Ru/Co (which may include Fe, B, and Co). For example, the Co/Ru/Co laminated structure results in ferromagnetic coupling (with parallel directions of magnetization) or antiferromagnetic coupling (with antiparallel directions of magnetization) between these Co layers according to a thickness of the Ru layer. When this nature is applied to the first ferromagnetic layer, e.g., a pinned layer in the spin-valve layer to generate an antiferromagnetic coupling state (i.e., antiparallel directions of magnetization between these two Co layers), the magnetic field generated from the pinned layer may be reduced. This structure itself has been known as an SFP (Synthetic Ferri Pinned Layer), and is effective to maintain linearization of the detected magnetic resistance; this structure is very useful when applied in a circumstance seeking high sensitivity, as in the present invention.

The first ferromagnetic layer, the non-magnetic intermediate layer, and the second ferromagnetic layer may be laminated in this order on a substrate. This structure corresponds to a bottom (type) spin valve. In addition, another non-magnetic intermediate layer may be laminated onto the second ferromagnetic layer, and a third ferromagnetic layer that has a substantially fixed direction of magnetization may be mounted onto the other non-magnetic intermediate layer. This structure corresponds to a dual or symmetric (type) spin valve. The second ferromagnetic layer, the non-magnetic intermediate layer, and the first ferromagnetic layer are laminated in this order on a substrate. This structure corresponds to a top (type) spin valve.

A magnetoresistive device of another aspect of the present invention includes a laminated film, and a mechanism for applying sense current in a direction of lamination in the laminated film, wherein the laminated film includes a first ferromagnetic layer having a substantially fixed direction of magnetization, a second ferromagnetic layer having a freely variable direction of magnetization according to an external magnetic field, and a non-magnetic intermediate layer that separates the first and second ferromagnetic layer from each other, wherein one of the first and second ferromagnetic layers has a lamination of a non-magnetic part and a ferromagnetic part in a direction of lamination in said laminated film. Although this magnetoresistive device may increase a spin dependent scattering effect of a conduction electron and thus enhance the magnetoresistance change, the ferromagnetic layer may be the first ferromagnetic layer or a combination of the first and second ferromangnetic layers; it is also not limited to a laminated structure, for example, dispersing non-magnetic particles in the ferromagnetic layer.

The present invention is applicable to a read head including the above magnetoresistive device, and a mechanism for supplying the sense current, and a mechanism for reading a signal from changed electric resistance of the magnetoresistive device which changes according to a signal magnetic field. The present invention is also applicable to a drive including a read part including the above read head and a write part, and a drive part for driving a magnetic record carrier to be recorded and reproduced by the read part. This read head increases the number of interferences between magnetic and non-magnetic layers and enhances the magnetoresistive change, thereby avoiding a generation of hysterisis and facilitating control over magnetic domain. The inventive read head is preferable, particularly because it may provide a highly sensitive readout from a magnetic record carrier with high surface recording density.

Other objects and further features of the present invention will become readily apparent from the following description of the embodiments with reference to accompanying drawings.

DETAILED DESCRIPTION OF THE INVENTION

Figure 1:
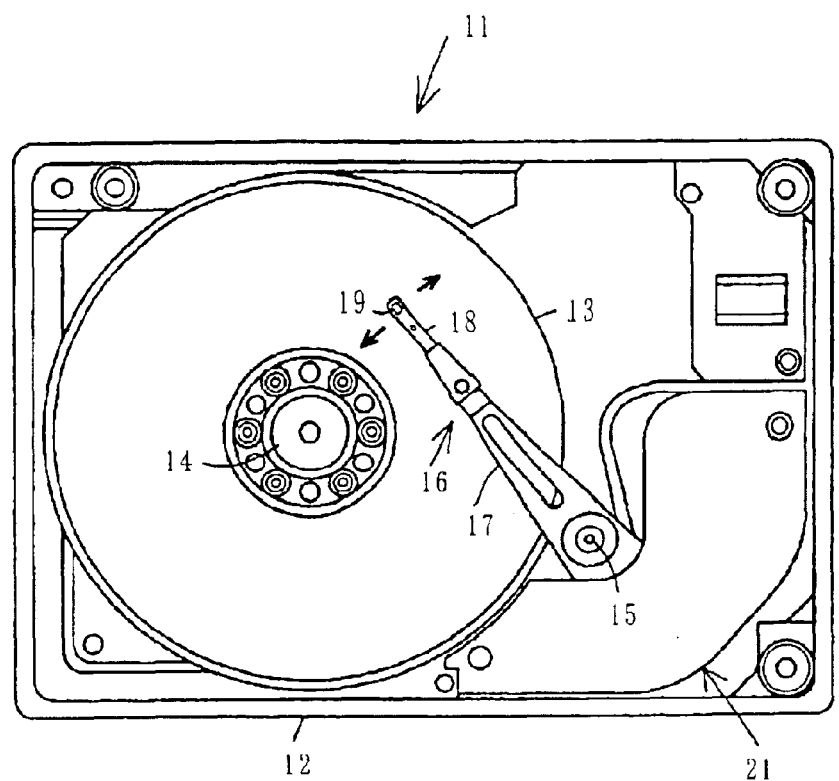
FIG. 1 is a plane view showing an internal structure of a hard disc drive as one example of the present invention.

Referring now to accompanying drawings, a description will be given of HDD 11 as one embodiment according to the present invention. The HDD 11 includes, in a housing 12 as shown in FIG. 1, one or more magnetic disc(s) 13, a spindle motor 14, and a magnetic head part. FIG. 1 is a plane view showing an internal structure of the HDD 11.

The housing 12 is made, for example, of aluminum die casting or stainless, and has a rectangular parallelepiped shape to which a cover (not shown) is coupled so as to seal its internal space. Each magnetic disc 13 in this embodiment has high recording density, such as 100 Gb/in$^2$ or higher, and is mounted on a spindle of the spindle motor 14.

The spindle motor 14 rotates the magnetic disc 13 at a high speed, such as 7200 rpm and 10,000 rpm, and includes a brushless DC motor and a spindle as its rotor part. For example, when two magnetic discs 13 are used, a disc, a spacer, a disc, and a clamp are stacked in this order on the spindle, and fixed by a bolt engaged with the spindle. Unlike this embodiment, the magnetic disc 13 may be a disc having a hub without a center hole, and the spindle rotates the disc through the hub.

The magnetic head part includes a slider 19, and an actuator 21 that serves as a mechanism for positioning and driving the slider 19.

Figure 2:
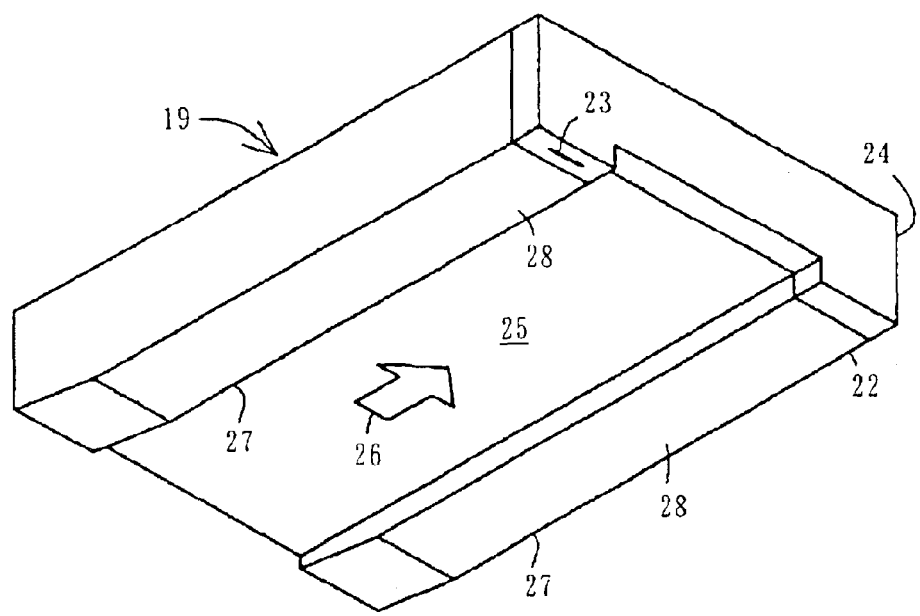
FIG. 2 is an enlarged perspective view of a slider of the hard disc drive shown in FIG. 1.

The slider 19 includes, as shown in FIG. 2, a slider body 22 having an approximately rectangular parallelepiped shape made of $Al_2O_3$—TiC (altic), and a head-device built-in film 24 united with at an air outflow end of the slider body 22 and made of $Al_2O_3$ (alumina), the film 24 including a built-in read/write head 23. Here, FIG. 2 is an enlarged perspective view of the slider 19. The slider body 22 and head-device built-in film 24 define a floatation surface 25 as a surface opposite to a carrier, i.e., the magnetic disc 13, for catching air current 26 generated from the rotating magnetic disc 13.

A pair of rails 27 are formed on the floatation surface 25, extending from an air inflow end to the air outflow end. A so-called air-bearing surface (referred to as "ABS" hereinafter) 28 is defined at a top surface of each rail 27. The buoyancy is generated at the ABS 28 according to an act of the air current 26. The head 23 embedded in the head-device built-in film 24 exposes at the ABS 28. The floatation system of the slider 19 is not limited to this form, but may use a known dynamic pressure lubricating system, a known static pressure lubricating system, a known piezoelectric control system, and any other known floatation system. Unlike the instant embodiment which uses a contact start stop system in which the slider 19 contacts the disc 13 at the time of stop, the slider 19 may be lifted up over the disc 13 before the disc 13 stops, held at a holding part (sometimes referred to as a ramp) located outside the disc 13 so as to hold the slider 19 in a non-contact manner with the disc 13, and dropped from the holding part over the disc 13 when the disc 13 is run, as in the dynamic or ramp loading system.

Figure 3:
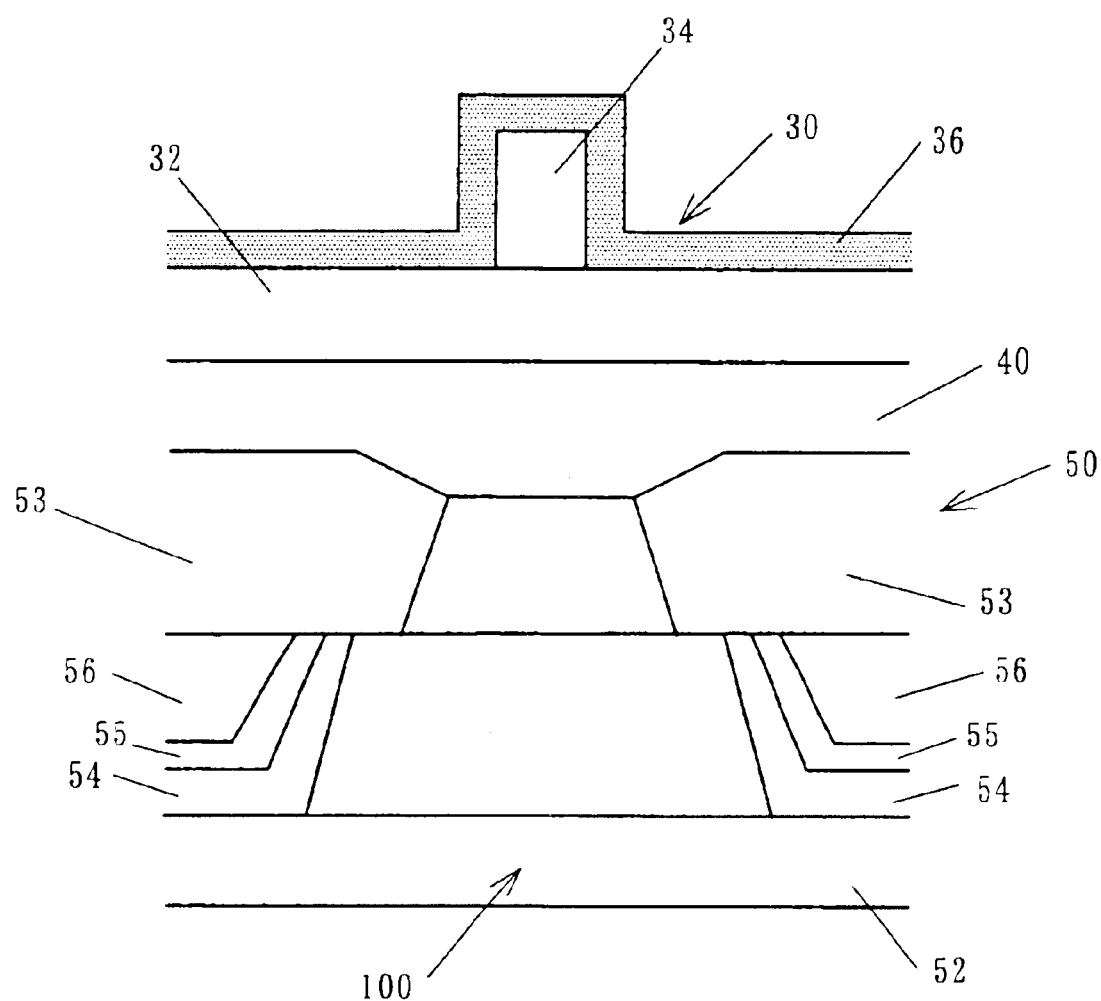
FIG. 3 is an enlarged sectional view showing a laminated structure of a head mounted onto the slider shown in FIG. 2.

A detailed description will be given of details of the floatation surface 25 with reference to FIG. 3. Here, FIG. 3 is a sectional view showing details of the floatation surface 25. The head 23 includes a magnetoresistive/inductive composite head including an inductive head device 30 for writing binary information into the magnetic disc 13 using a magnetic field induced by a conductive coil pattern (not shown), and a magnetoresistive ("MR" hereinafter) head device 50 for reading resistance as binary information changing according to a magnetic field generated by the magnetic disc 13.

The inductive head device 30 includes a non-magnetic gap layer 32, an upper magnetic pole layer 34, an $Al_2O_3$ film 36, and an upper shield-upper electrode layer 40. As discussed later, the upper shield-upper electrode layer 40 may form part of the MR head device 50.

The non-magnetic gap layer 32 spreads on a surface of the upper shield-upper electrode layer 40, which will be described later, and is made, for example, of $Al_2O_3$. The upper magnetic pole layer 34 faces the upper shield-upper electrode layer 40 through the non-magnetic gap layer 32, and is made, for example, of NiFe. The $Al_2O_3$ film 36 covers the upper magnetic pole layer 34 on a surface of the non-magnetic gap layer 32, and forms the head-device built-in film 24. The upper magnetic pole layer 34 and upper shield-upper electrode layer 40 cooperatively form a magnetic core in the inductive write head device 30. A lower magnetic pole layer in the inductive write head device 30 serves as the upper shield-upper electrode layer 40 in the MR head device 50. As the conductive coil pattern induces a magnetic field, a magnetic-flux flow between the upper magnetic pole layer 34 and upper shield-upper electrode layer 40 leaks from the floatation surface 25 due to acts of the non-magnetic gap layer 32. The leaking magnetic-flux flow forms a signal magnetic field (or gap magnetic field).

The MR head device 50 includes the upper shield-upper electrode layer 40, a lower shield-lower electrode layer 52, insulating layers 53 and 54, a primary coat layer 55, a hard ferromagnetic layer 56, and a spin-valve film 100. The upper shield-upper electrode layer 40 and lower shield-lower electrode layer 52 are made, for example, of FeN and NiFe, and supply the sense current to the spin-valve film 100. Thus, the instant embodiment applies the sense current perpendicular to a direction of lamination. The insulating layers 53 and 54 insulate the upper shield-upper electrode layer 40 and lower shield-lower electrode layer 52, and are made, for example, of $Al_2O_3$. The hard ferromagnetic layer 56 is made, for example, of such a magnetic material as CoPt alloy and CoCrPt alloy, and applies constant bias at the time of operations of the free ferromagnetic layer 120, etc., which will be described later. The primary coat layer 55 serves to display characteristics of the hard ferromagnetic layer 56.

The spin-valve film 100 has a laminated structure that basically includes, in this order, a free ferromagnetic layer, a non-magnetic intermediate layer, a pinned magnetic layer, and an exchange-coupling layer, forming a GMR sensor. The GMR sensor in this embodiment forms a GMR-CPP sensor as a CPP sensor that applies the sense current perpendicular to laminated surfaces in the sensor film. Characteristically, the spin-valve film 100 uses two or more ferromagnetic metal layers separated by a non-magnetic metal layer in a direction of lamination, to form the free ferromagnetic layer.

A spin-valve film of the above conventional CPP configuration has advantages in sufficiently reducing hysterisis and controlling magnetic domain, but it has been difficult to obtain large changes in magnetic resistance. After devoting themselves to review this problem, the instant inventors have addressed a fact that the spin-valve film of the CPP configuration has only two interfaces between magnetic and non-magnetic layers, and assumed that as the number of interferences increases the magnetoresistance change increases. According to the magnetoresistance effect, a magnetic layer of one direction allows conduction electrons in one spin state selected from spin-up and spin-down to pass through easily, but conduction electrons in the other spin state do not easily pass and scatter (spin dependent scattering). Therefore, they have considered that the increased number of interferences could enlarge a difference in spin dependent scattering effect when conduction electrons in these two kinds of spin states pass through the magnetic layers. Some examples, which will be described later, use a structure that laminates magnetic and non-magnetic metal layers plural times in the free ferromagnetic layer that changes its direction of magnetization in response to a signal magnetic field from the carrier, in order to enhance the spin dependent scattering effect of conduction electrons at the interference between magnetic and non-magnetic layers, which is a primary factor of the magnetoresistance effect in the spin-valve film of the CPP configuration.

Figure 10:
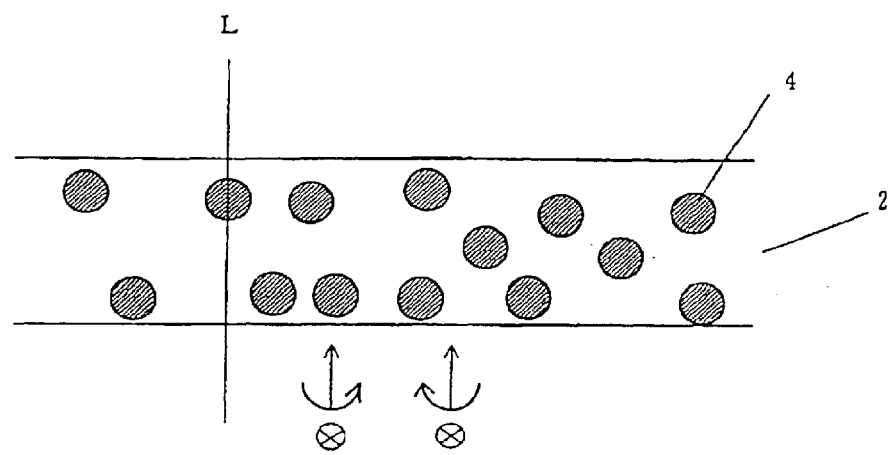
FIG. 10 is an enlarged sectional view of a sixth embodiment according to the present invention applicable to the configuration of the spin-valve film in the head shown in FIG. 3.

An increase of the magnetoresistance change is not limited to means for forming the free ferromagnetic layer by laminating plural times a ferromagnetic metal layer and a non-magnetic metal layer. For example, unlike the instant embodiment which sandwiches a non-magnetic metal layer between two ferromagnetic metal layers, different materials may be used for the upper and lower ferromagnetic metal layers. Instead of or in addition to the free ferromagnetic layer, the pinned magnetic layer may be formed by laminating plural times a ferromagnetic metal layer and a non-magnetic metal layer. An increase the magnetoresistive change does not have to accompany with to a laminated structure. For example, as shown in FIG. 10, in which non-magnetic particles 4 are dispersed in a magnetic layer 2, the non-magnetic particle 4 divides the magnetic part into two parts, for example, in a line L along a direction of lamination in the spin-valve film. As the spin dependent scattering effect is enhanced for conduction electrons that pass along the line L, the same effect may be obtained as that in which the pinned magnetic layer is formed by laminating plural times ferromagnetic and non-magnetic metal layers.

Preferably, directions of magnetization of ferromagnetic metal layers are set up parallel for the following reasons in order to laminate a plurality of ferromagnetic metal layers and thus to enhance the magnetoresistive change:

Firstly, when ferromagnetic metal layers are laminated via a non-magnetic metal layer, directions of magnetization of ferromagnetic metal layers may be arranged to be parallel or antiparallel due to interactions between ferromagnetic metal layers. For instance, such a so-called synthetic ferri structure as uses a Co/Ru/Co laminated film for a pinned layer to stabilize an exchange-coupling magnetic field uses a layer thickness of the Ru layer of 5–9 Å for antiferromagnetic coupling magnetizations between the adjacent Co layers. Indeed, no examples have been proposed to use the synthetic ferri structure that arranges directions of magnetization between the Co layers to be parallel to each other.

On the other hand, the instant embodiment uses a laminated structure for the free layer with such a layer thickness of a non-magnetic metal layer that directions of magnetization in the ferromagnetic layers are parallel to each other, whereby the free layer of a laminated structure preferably behaves as one body in the magnetic field from the carrier. When the directions of magnetization in these two ferromagnetic metal layers in the free layer of the laminated structure are made arranged to be antiparallel, like the conventional synthetic ferri structure, low and high resistance interferences are simultaneously formed for each spin direction, undesirably canceling out the spin dependent scattering effect and reducing a rate of change in magnetic resistance. On the other hand, parallel directions of magnetization of ferromagnetic layers would desirably facilitate control over magnetic domain and reduction of hysteresis.

A non-magnetic metal layer in the free layer of the laminated structure may use such metal as Cu, Ag, Au, etc. Such metal may provoke the spin dependent scattering effect when laminated onto a ferromagnetic metal layer.

The larger number of laminations of magnetic and non-magnetic layers for forming the free layer of the laminated structure is effective since that increases the number of interferences becomes. Nevertheless, part where the lamination exceeds a distance (or a spin-diffusion length) within which a conduction electron may maintain spin information has no contribution to magnetoresistive changes, but increases device's resistance and decreases a rate of magnetoresistive change.

Another primary factor of a change in magnetic resistance is a scattering effect of a conduction electron (or known as a bulk scattering) dependent upon a direction of magnetization in the ferromagnetic film, and this effect is also enhanced within the spin-diffusion length in proportion to a layer thickness of the free layer.

On the other hand, as a layer thickness of a free layer increases, the magnetic moment in the free layer increases and its sensitivity relative to the signal magnetic field from the carrier decreases. Thus realistically, it is preferable to form a free layer with a layer thickness of about 3–10 nm, more preferably about 5–6 nm, with a NiFe film. Usually, a spin-valve film is formed using a magnetron sputter device, ion beam sputter device, vacuum evaporator, etc., but when a ferromagnetic metal layer having a layer thickness of 1 nm or less is formed, it grows in a streaky shape. It is thus difficult to form a continuous film and sufficient ferromagnetic characteristic cannot be obtained. Therefore, two or three ferromagnetic metal layers each having about 1–2 nm are preferably laminated through a non-magnetic metal layer in order for the inventive free layer of the laminated structure to provide highly sensitive detection characteristic to a signal from a feeble signal magnetic field from the record carrier.

As means for increasing scattering at an interference in the spin-valve film of a CPP configuration, a so-called dual spin valve structure is also effective in which a non-magnetic intermediate layer/a pinned ferromagnetic layer/an exchange-coupling layer are formed at both upper and lower sides of the free ferromagnetic layer as a center. The inventive synthetic ferri structure, when used for the free layer of the dual spin-valve film, would improve a rate of change in magnetic resistance.

The spin-valve film includes so-called bottom and top (types) spin valves: The bottom spin valve arranges an exchange-coupling layer/a pinned ferromagnetic layer at a side closer to a substrate to be laminated, while the top spin valve arranges the free ferromagnetic layer at the side closer to the substrate. The inventive free layer of the laminated structure is applicable to both structures of spin-valve films, and apparently exhibits the same operations.

In order for the spin-valve film to be used for the read head, the free layer should have single magnetic domain in a direction perpendicular to an entry direction of the signal magnetic field for a stable magnetic field response characteristic. According to the inventive laminated free structure, the ferromagnetic metal layers in the free layer of the laminated structure have the same directions of magnetization, and thus it is apparent to easily apply the conventional magnetic-domain control structure using a hard magnetic material formed adjacent to the free layer.

Next follows several examples of the spin-valve film 100.

EXAMPLES

The lower electrode layer made of Cu/Au with a layer thickness of 400 nm is formed by magnetron sputtering, and patterned by usual photolithography. Then, an MR film having the following structure is formed using usual magnetron sputtering onto an attic substrate formed by an ion milling device.

Comparison Example 1

Figure 4:
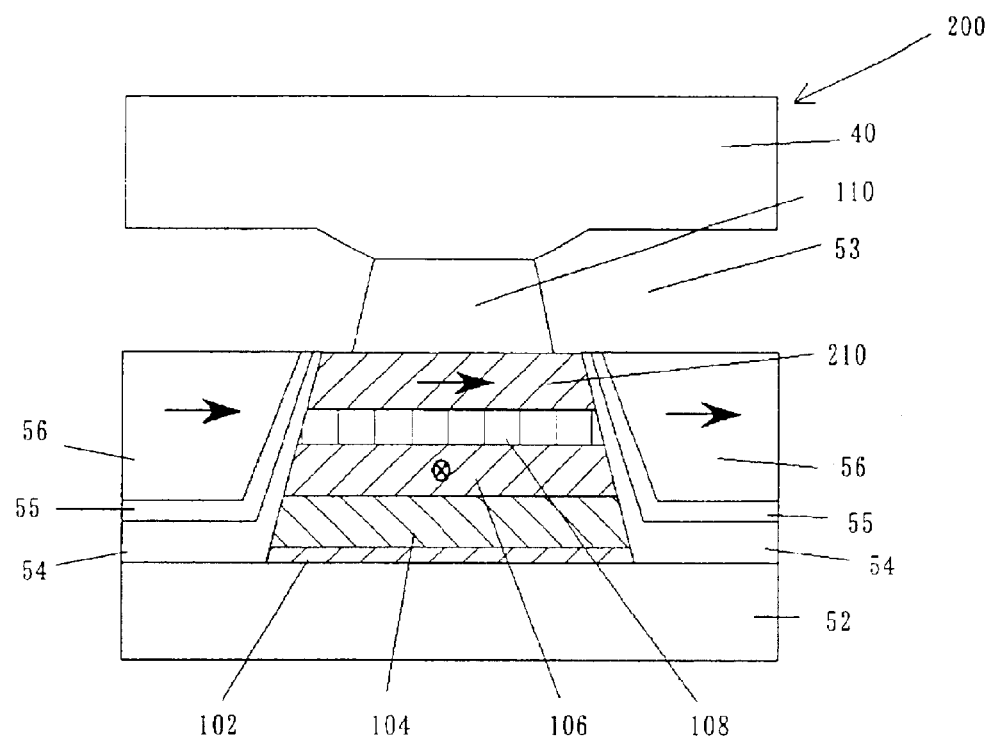
FIG. 4 is an enlarged sectional view of a comparison example relative to embodiments according to the present invention, which is applied to a configuration of a spin-valve film of the head shown in FIG. 3.

As shown in FIG. 4, a bottom spin-valve film 200 is formed as a comparison example. Here, FIG. 4 is an enlarged sectional view of the spin-valve film 200 applied to a structure shown in FIG. 3. Laminated, in order from down to up, on a substrate on its top of which a lower electrode is formed (i.e., lower shield-lower electrode layer) 52 are a primary coat layer (or sometimes referred to as an orientation control film) 102 that includes a layer made of Ta with a layer thickness of 5 nm and a layer made of NiFe with a layer thickness of 2 nm, an exchange-coupling layer (or sometimes referred to as a pinning or antiferromagnetic layer) 104 made of PdPtMn with a layer thickness of 15 nm for fixing a direction of magnetization of an adjacent pinned ferromagnetic layer, the pinned ferromagnetic layer 106 made of CoFeB with a layer thickness of 3 nm, a non-magnetic intermediate layer (or referred to as a spacer layer) 108 made of Cu with a layer thickness of 4 nm, a free ferromagnetic layer 210 made of CoFeB with a layer thickness of 3 nm, and an electrode 110 that includes a layer made of Cu with a layer thickness of 1 nm, and a layer made of Au with a layer thickness of 10 nm.

Example 1

Figure 5:
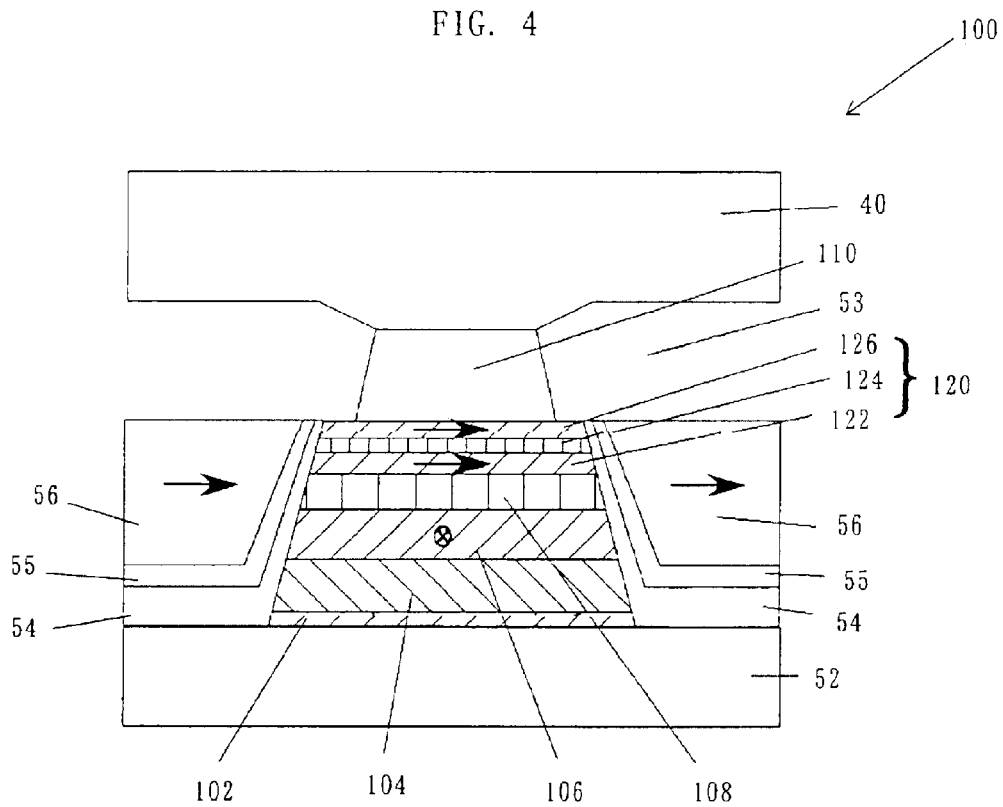
FIG. 5 is an enlarged sectional view of a first embodiment according to the present invention applicable to the configuration of the spin-valve film in the head shown in FIG. 3.

As shown in FIG. 5, there is formed a bottom spin-valve film 100 of a first embodiment according to the present invention. Here, FIG. 5 is an enlarged sectional view of the spin-valve film 100 applicable to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the exchange-coupling layer 104 made of PdPtMn with a layer thickness of 15 nm, the pinned ferromagnetic layer 106 made of CoFeB with a layer thickness of 3 nm, the non-magnetic intermediate layer 108 made of Cu with a layer thickness of 4 nm, a free ferromagnetic layer 120 with a layer thickness of 5 nm, and the electrode 110 that includes the layer made of Cu with a layer thickness of 1 nm, and the layer made of Au with a layer thickness of 10 nm.

The free ferromagnetic layer 120 includes a first free ferromagnetic layer 122 as a ferromagnetic metal layer made of CoFeB with a layer thickness of 1.5 nm, a non-magnetic metal layer 124 made of Cu with a layer thickness of 2 nm, and a second free ferromagnetic metal layer 126 as a ferromagnetic metal layer made of CoFeB with a layer thickness of 1.5 nm.

Example 2

Figure 6:
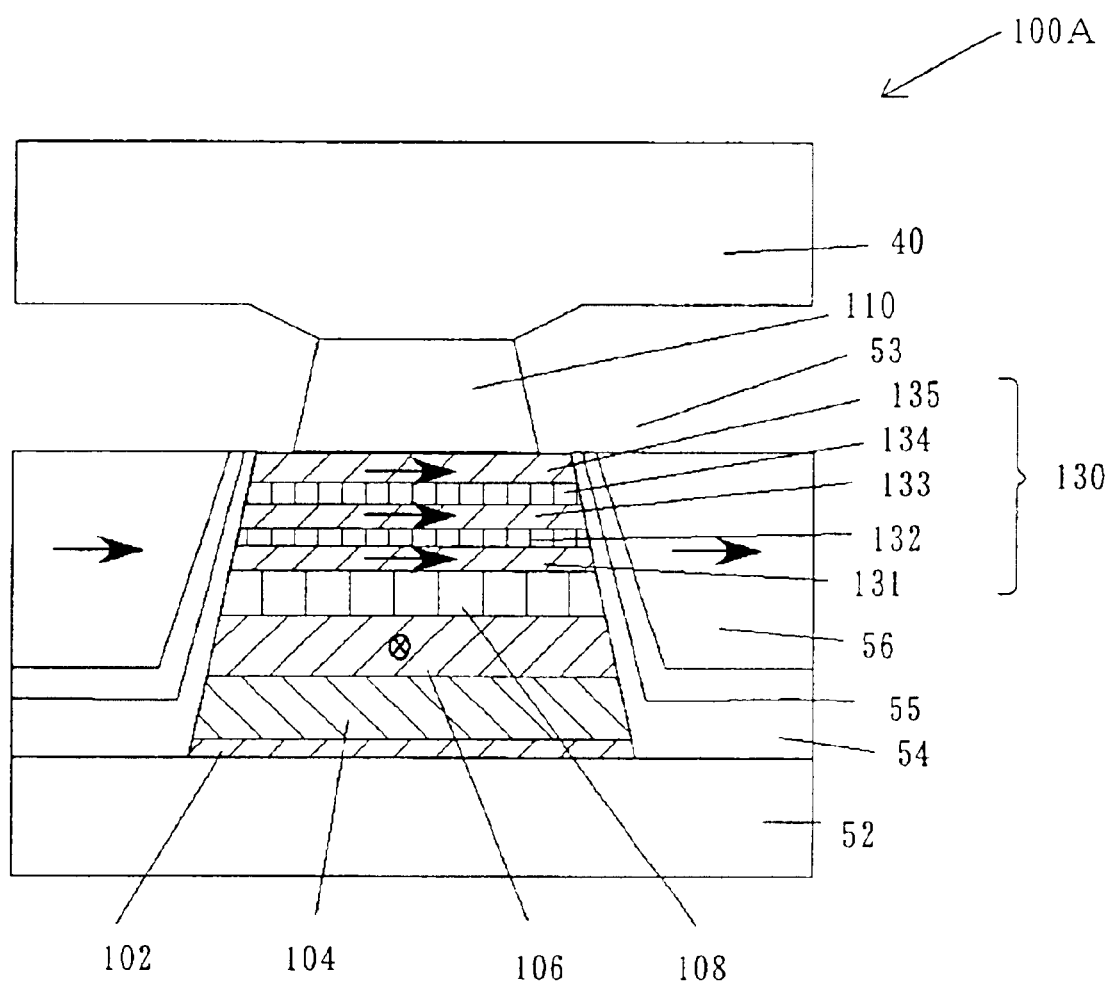
FIG. 6 is an enlarged sectional view of a second embodiment according to the present invention applicable to the configuration of the spin-valve film in the head shown in FIG. 3.

As shown in FIG. 6, there is formed a bottom spin-valve film 100A of a second embodiment according to the present invention. Here, FIG. 6 is an enlarged sectional view of the spin-valve film 100A applicable to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the exchange-coupling layer 104 made of PdPtMn with a layer thickness of 15 nm, the pinned ferromagnetic layer 106 made of CoFeB with a layer thickness of 3 nm, the non-magnetic intermediate layer 108 made of Cu with a layer thickness of 4 nm, a free ferromagnetic layer 130 with a layer thickness of 7 nm, and the electrode 110 that includes the layer made of Cu with a layer thickness of 1 nm, and the layer made of Au with a layer thickness of 10 nm.

The free ferromagnetic layer 130 includes a ferromagnetic metal layer 131 made of CoFeB with a layer thickness of 1 nm, a non-magnetic metal layer 132 made of Cu with a layer thickness of 2 nm, a ferromagnetic metal layer 133 made of CoFeB with a layer thickness of 1 nm, a non-magnetic metal layer 134 made of Cu with a layer thickness of 2 nm, and a ferromagnetic metal layer 135 made of CoFeB with a layer thickness of 1 nm.

Comparison Example 2

A bottom spin-valve film (not shown) is formed as a comparison example, which is applied to a structure shown in FIG. 3, and has a synthetic ferri structure. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the exchange-coupling layer 104 made of PdPtMn with a layer thickness of 15 nm, a pinned ferromagnetic layer 140 with a layer thickness of 7.8 nm having the synthetic ferri structure which will be described with reference to FIG. 7, the non-magnetic intermediate layer 108 made of Cu with a layer thickness of 4 nm, the free ferromagnetic layer 210 made of CoFeB with a layer thickness of 3 nm, and the electrode 110 that includes the layer made of Cu with a layer thickness of 1 nm, and the layer made of Au with a layer thickness of 10 nm. The pinned ferromagnetic layer 140 includes a first pinned ferromagnetic layer 142 made of CoFeB with a layer thickness of 3 nm, an antiferromagnetic exchange-coupling layer 144 made of Ru with a layer thickness of 0.8 nm, and a second pinned ferromagnetic layer 146 made of CoFeB with a layer thickness of 4 nm.

Example 3

Figure 7:
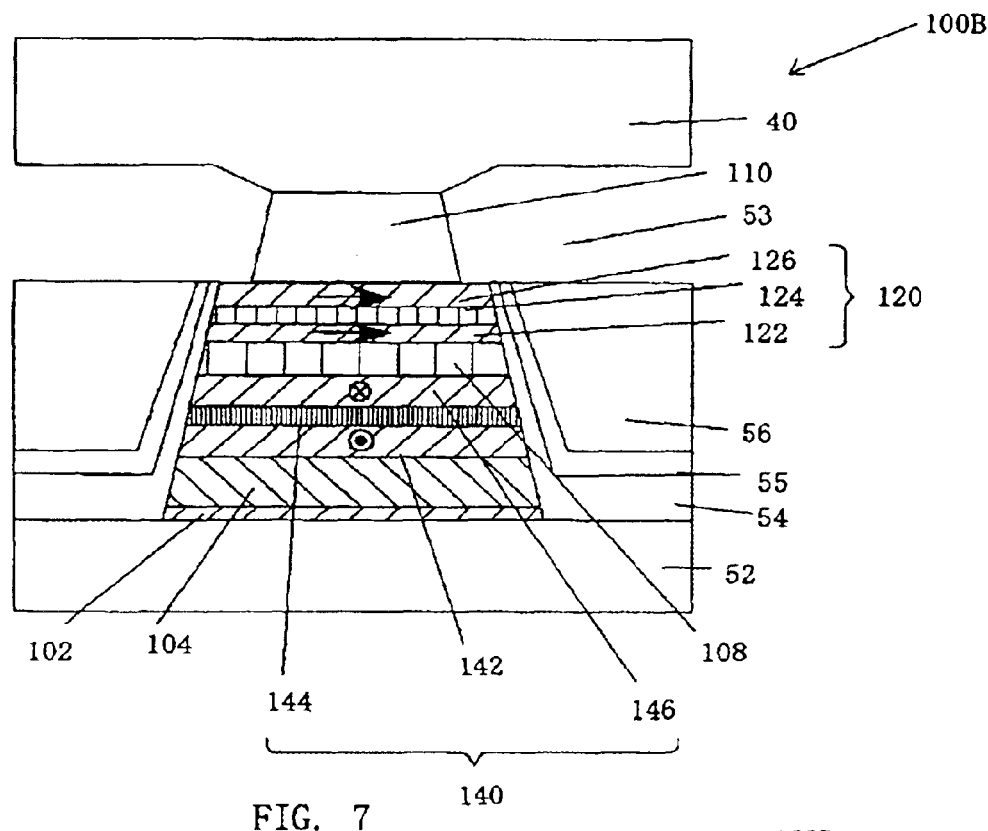
FIG. 7 is an enlarged sectional view of a third embodiment according to the present invention applicable to the configuration of the spin-valve film in the head shown in FIG. 3.

As shown in FIG. 7, there is formed a bottom spin-valve film 100B having a synthetic ferri structure of a third embodiment according to the present invention. Here, FIG. 7 is an enlarged sectional view of the spin-valve film 100B applicable to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the exchange-coupling layer 104 made of PdPtMn with a layer thickness of 15 nm, the pinned ferromagnetic layer 140 having the synthetic fern structure with a layer thickness of 7.8 nm, the non-magnetic intermediate layer 108 made of Cu with a layer thickness of 4 nm, the free ferromagnetic layer 120 with a layer thickness of 5 nm, and the electrode 110 that includes the layer made of Cu with a layer thickness of 1 nm, and the layer made of Au with a layer thickness of 10 nm.

The free ferromagnetic layer 120 includes a first free ferromagnetic layer 122 made of CoFeB with a layer thickness of 1.5 nm, a non-magnetic metal layer 124 made of Cu with a layer thickness of 2 nm, and a second free ferromagnetic metal layer 126 made of CoFeB with a layer thickness of 1.5 nm. The pinned ferromagnetic layer 140 includes a first pinned ferromagnetic layer 142 made of CoFeB with a layer thickness of 3 nm, an antiferromagnetic exchange-coupling layer 144 made of Ru with a layer thickness of 0.8 nm, and a second pinned ferromagnetic layer 146 made of CoFeB with a layer thickness of 4 nm.

Example 4

There is formed a bottom spin-valve film 100C (not shown) having a synthetic ferri structure of a fourth embodiment according to the present invention and applicable to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the exchange-coupling layer 104 made of PdPtMn with a layer thickness of 15 nm, the pinned ferromagnetic layer 140 having the synthetic ferri structure with a layer thickness of 7.8 nm, the non-magnetic intermediate layer 108 made of Cu with a layer thickness of 4 nm, the free ferromagnetic layer 130 with a layer thickness of 7 nm, and the electrode 110 that includes the layer made of Cu with a layer thickness of 1 nm, and the layer made of Au with a layer thickness of 10 nm.

The free ferromagnetic layer 130 includes a ferromagnetic metal layer 131 made of CoFeB with a layer thickness of 1 nm, a non-magnetic metal layer 132 made of Cu with a layer thickness of 2 nm, a ferromagnetic metal layer 133 made of CoFeB with a layer thickness of 1 nm, a non-magnetic metal layer 134 made of Cu with a layer thickness of 2 nm, and a ferromagnetic metal layer 135 made of CoFeB with a layer thickness of 1 nm. The pinned ferromagnetic layer 140 includes a first pinned ferromagnetic layer 142 made of CoFeB with a layer thickness of 3 nm, an antiferromagnetic exchange-coupling layer 144 made of Ru with a layer thickness of 0.8 nm, and a second pinned ferromagnetic layer 146 made of CoFeB with a layer thickness of 4 nm.

Comparison Example 3

A dual spin-valve film (not shown) is formed as a comparison example, which is applied to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, a first exchange-coupling layer 104A made of PdPtMn with a layer thickness of 15 nm, a first pinned ferromagnetic layer 106A with a layer thickness of 3 nm, a first non-magnetic intermediate layer 108A made of Cu with a layer thickness of 4 nm, the free ferromagnetic layer 210 made of CoFeB with a layer thickness of 3 nm, a second non-magnetic intermediate layer 152 made of Cu with a layer thickness of 4 nm, a second pinned ferromagnetic layer 154 made of CoFeB with a layer thickness of 3 nm, a second exchange-coupling layer 156 made of PdPtMn with a layer thickness of 15 nm, and an electrode-added protective layer 158 that includes a layer made of Ta with a layer thickness of 5 nm, and a layer made of Au with a layer thickness of 10 nm. These layers 104A–158 will be described below with reference to FIG. 8.

Example 5

Figure 8:
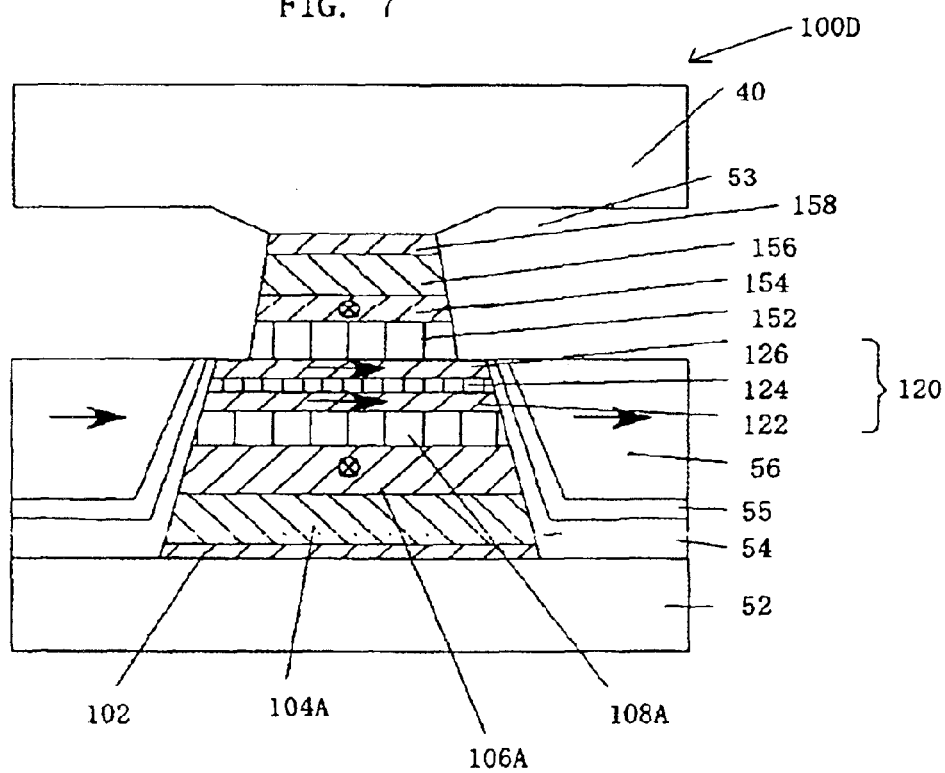
FIG. 8 is an enlarged sectional view of a fourth embodiment according to the present invention applicable to the configuration of the spin-valve film in the head shown in FIG. 3.

As shown in FIG. 8, there is formed a dual spin-valve film 100D of a fifth embodiment according to the present invention. Here, FIG. 8 is an enlarged sectional view of the spin-valve film 100D applicable to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the first exchange-coupling layer 104A made of PdPtMn with a layer thickness of 15 nm, the first pinned ferromagnetic layer 106A with a layer thickness of 3 nm, the first non-magnetic intermediate layer 108A made of Cu with a layer thickness of 4 nm, the free ferromagnetic layer 120 with a layer thickness of 5 nm, the second non-magnetic intermediate layer 152 made of Cu with a layer thickness of 4 nm, the second pinned ferromagnetic layer 154 made of CoFeB with a layer thickness of 3 nm, the second exchange-coupling layer 156 made of PdPtMn with a layer thickness of 15 nm, and the electrode-added protective layer 158 that includes a layer made of Ta with a layer thickness of 5 nm, and a layer made of Au with a layer thickness of 10 nm. The layers 104A–106A are substantially the same as layers 104–106, although they are assigned different names.

As described above, the free ferromagnetic layer 120 includes the ferromagnetic metal layer 122 made of CoFeB with a layer thickness of 1.5 nm, the non-magnetic metal layer 124 made of Cu with a layer thickness of 2 nm, and the ferromagnetic metal layer 126 made of CoFeB with a layer thickness of 1.5 nm.

Comparison Example 4

A conventional top spin-valve film (not shown) is formed as a comparison example, which is applied to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the free ferromagnetic layer 210 made of CoFeB with a layer thickness of 3 nm a non-magnetic intermediate layer 160 made of Cu with a layer thickness of 4 nm, a pinned ferromagnetic layer 162 made of CoFeB with a layer thickness of 3 nm, an exchange-coupling layer 164 made of PdPtMn with a layer thickness of 15 nm, and an electrode-added protective layer 158 that includes a layer made of Ta with a layer thickness of 5 nm, and a layer made of Au with a layer thickness of 10 nm. These layers 160–164 will be described later with reference to FIG. 9.

Example 6

Figure 9:
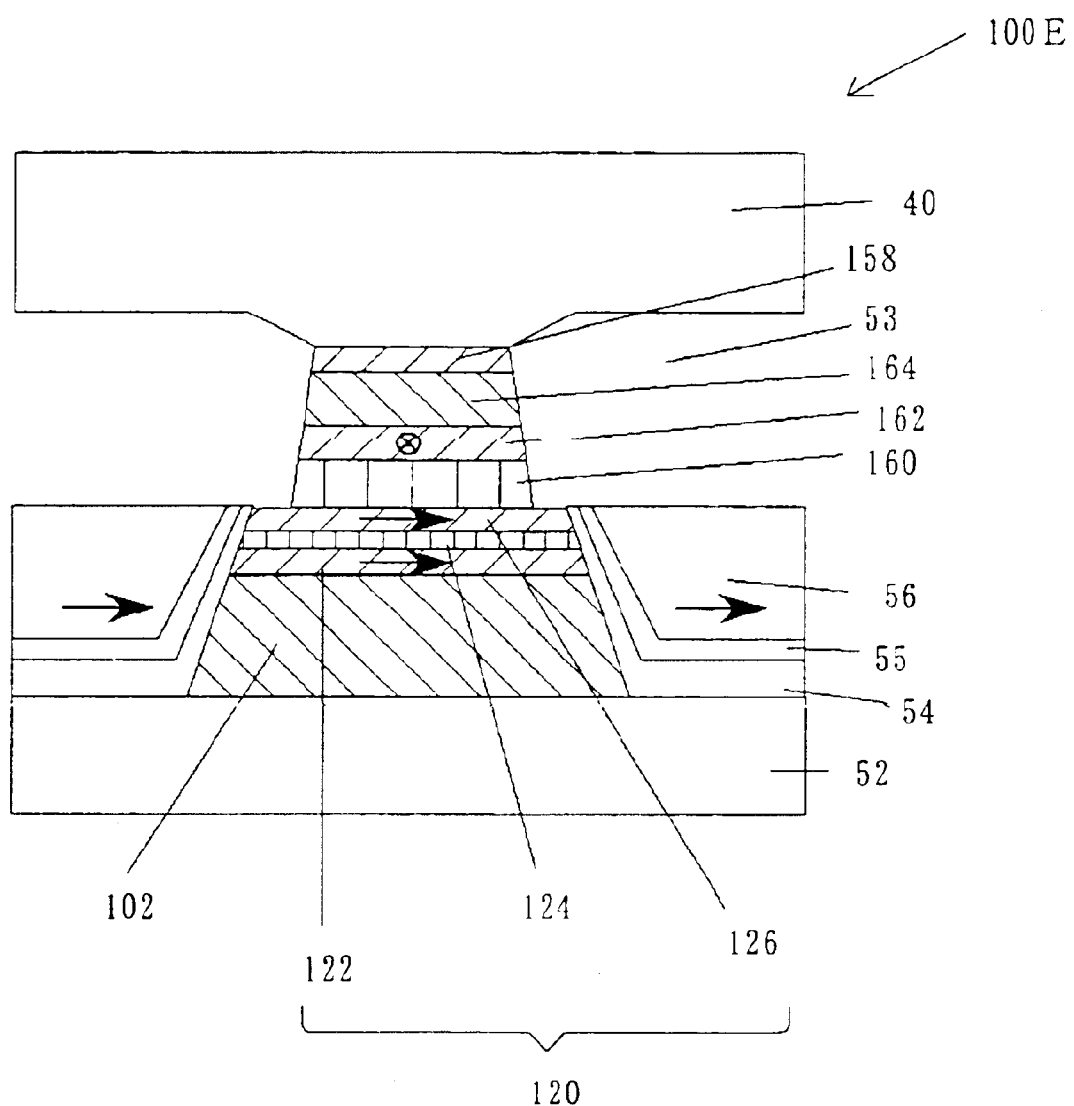
FIG. 9 is an enlarged sectional view of a fifth embodiment according to the present invention applicable to the configuration of the spin-valve film in the head shown in FIG. 3.

As shown in FIG. 9, there is formed a dual spin-valve film 100E of a sixth embodiment according to the present invention. Here, FIG. 9 is an enlarged sectional view of the spin-valve film 100E applicable to a structure shown in FIG. 3. Laminated, in order from down to up, on the lower shield-lower electrode layer 52 are the primary coat layer 102 that includes the layer made of Ta with a layer thickness of 5 nm and the layer made of NiFe with a layer thickness of 2 nm, the free ferromagnetic layer 120 with a layer thickness of 5 nm, the non-magnetic intermediate layer 160 made of Cu with a layer thickness of 4 nm, the pinned ferromagnetic layer 162 made of CoFeB with a layer thickness of 3 nm, the exchange-coupling layer 164 made of PdPtMn with a layer thickness of 15 nm, and the electrode-added protective layer 158 that includes a layer made of Ta with a layer thickness of 5 nm, and a layer made of Au with a layer thickness of 10 nm.

In the above inventive examples and comparison examples, a typical comparison (a ratio of atomic volume) in each alloy layer is 81Ni-19Fe, 89Co-9Fe-2B, and 30Pd-18Pt-52Mn.

Following a formation of each film, a thermal treatment was conducted to order the PdPtMn exchange-coupling layer, in a vacuum magnetic field at 280° C. for three hours under magnetic-field application of 2 tesla.

A device was processed at a size of 0.3×0.3 μm to 1×1 μm using the usual photolithography and ion milling method. Then, an $Al_2O_3$ insulating layer 53 with a layer thickness of about 70 nm was formed using magnetron sputtering in part other than the device, and then a Cu upper electrode layer with a layer thickness of 300 nm was formed, whereby the upper shield-upper electrode layer 40 is formed.

Magentoresistance curves as device characteristics were measured within a magnetic-field application range of ±500 Oe (oersted) using a four-terminal method.

In a device of the CPP configuration, device resistance R and a change in the device resistance ΔR are in inverse proportion to a device sectional area A, and thus the products RA and ΔRA become constant for each magnetoresistance film.

Therefore, RA and ΔRA were used as indexes for indicating device characteristics. The MR ratio (%) in the CIP configuration is indicated by ΔRA/RA. Table 1 shows a device evaluation result. Table 1 conveniently indicates comparison example 1, instant examples 1 and 2, comparison example 2, instant examples 3 and 4, comparison example 3, instant example 5, comparison example 6, instant example 6 as samples 1–10.

TABLE 1

| Samples | SV Type* | PFL** | The number of FLs in Free Layer | RA ($\Omega\ \mu m^2$) | ΔRA (m $\Omega\ \mu m^2$) | MR Ratio (%) |
|---|---|---|---|---|---|---|
| 1) | Bottom | Normal | 1 | 0.08 | 0.6 | 0.75 |
| 2) | Bottom | Normal | 2 | 0.08 | 1 | 1.25 |
| 3) | Bottom | Normal | 3 | 0.08 | 1.2 | 1.50 |
| 4) | Bottom | SFS*** | 1 | 0.09 | 0.6 | 0.67 |
| 5) | Bottom | SFS | 2 | 0.09 | 0.95 | 1.06 |
| 6) | Bottom | SFS | 3 | 0.09 | 1.2 | 1.33 |
| 7) | Dual | Normal | 1 | 0.13 | 1.8 | 1.38 |
| 8) | Dual | Normal | 2 | 0.13 | 2.5 | 1.92 |
| 9) | Top | Normal | 1 | 0.08 | 0.5 | 0.63 |
| 10) | Top | Normal | 2 | 0.08 | 0.8 | 1.00 |

*Type of Spin-Valve Film
**Structure of Pinned Ferromagnetic Layer
***Synthetic Ferri Structure As understood from Table 1, it was confirmed that any spin-valve film having the increased number of ferromagnetic metal layers in the free ferromagnetic layer showed ΔRA and MR ratio about 1.5 times to twice as many as those of the comparison examples.

The primary coat layer 102 uses Ta to improve NiFe crystalline and soft magnetic characteristics. The electrode 110 uses Cu because of its congeniality to Co in the free layers 126, 210, etc. The protective layer 158 uses Ta because of its congeniality to Mn, and serves as a cap layer to prevent deterioration of the laminated part.

In the third and fourth examples, two CoFeB layers in the pinned layer 140 of a CoFeB/Ru/CoFeB structure cause antiferromagnetic coupling (i.e., antiparallel directions of magnetization) and reduce a magnetic field generated from the pinned layer 140. This is effective in maintaining linearization of a detection of the magnetoresistance (that is, symmetrical signals), and particularly suitable for such circumstances as seek the high sensitivity as in the present invention.

Turning back to FIG. 1, the actuator 21 includes a voice coil motor (not shown in FIG. 1), a support shaft 15, and a carriage 16.

The voice coil motor may use any technology known in the art, and a detailed description thereof will be omitted herein. For example, the voice coil motor includes a permanent magnet fixed onto an iron plate fixed in the housing 12, and a mobile magnet fixed onto the carriage 16. The support shaft 15 is inserted into a cylindrical hollow hole in the carriage 16, and arranged such that it extends perpendicular to the paper surface in FIG. 1 in the housing 12. The carriage 16 includes a rigid arm 17 rotatably or swingably around the support shaft 15, and a suspension 18 that is attached to a tip of the arm 17 and extends forward from the arm 17. The suspension 18 is, for example, a Watlas type suspension made of stainless, which uses a gimbal spring (not shown) to cantilever the slider 19. The suspension 18 supports a wiring part connected to the slider 19 through a lead, etc. Since the wiring part is so small that it is omitted in FIG. 1. The sense current, read-in data, read-out data are supplied and output between the head 23 and the wiring part through such a lead. The suspension 18 applies an elastic force to the slider 19 against a surface of the magnetic disc 13.

Figure 11:
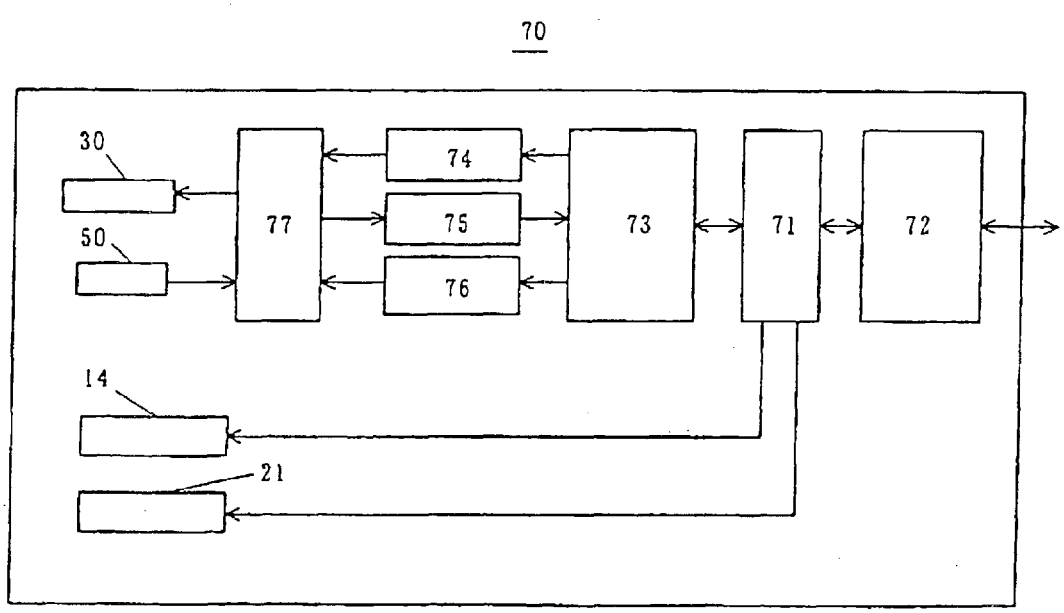
FIG. 11 is a block diagram for explaining a control system in the hard disc drive shown in FIG. 2.

FIG. 11 shows a control block diagram of a control system 70 in the HDD 11. The control system 70, which may be implemented as a control board, etc. in the HDD 11, includes a control part 71, an interface 72, a hard disc controller (referred to as "HDC" hereinafter) 73, a write modulation part 74, a read demodulation part 75, a sense-current control part 76, and a head IC 77. Of course, they are not necessarily arranged as one member; for example, only the head IC 77 is connected to the carriage 16.

The control part 71 covers any processor such as a CPU and MPU irrespective of its name, and controls each part in the control system 70. The interface 72 connects the HDD 11 to an external apparatus, such as a personal computer ("PC" hereinafter) as a host. The HDC 73 sends to the control part 71 data that has been demodulated by the read demodulation part 75, sends data to the write modulation part 74, and sends to the sense-current control part 76 a current value as set by the control part 71. Although FIG. 11 shows that the control part 71 provides servo control over the spindle motor 14 and (a motor in) the actuator 21, the HDC 73 may serve as such servo control. The write modulation part 74 modulates data and supplies data to the head IC 72, which data has been supplied from the host through the interface 72 and is to be written down onto the disc 13 by the inductive head 30. The read demodulation part 75 demodulates data into an original signal by sampling data read from the disc 13 by the MR head device 50. The write modulation part 74 and read demodulation part 75 may be recognized as one signal processing part. The head IC 77 serves as a preamplifier. Each part may apply any structure known in the art, and a detailed description thereof will be omitted.

In operation of the HDD 11, the control part 71 drives the spindle motor 14 and rotates the disc 13. The airflow associated with the rotation of the disc 13 is introduced between the disc 13 and slider 19, forming minute air film and thus generating the buoyancy that enables the slider 19 to float over the disc surface. The balance between the buoyancy and the elastic force spaces the slider 19 from the disc 13 by a constant distance.

The control part 71 then controls the actuator 21 and rotates the carriage 16 around the support shaft 15 for head 23's seek for a target track on the disc 13. The instant embodiment thus uses a swing arm type in which the slider 19 draws an arc locus around the support shaft 15, but the present invention is applicable to a linear type in which the slider 19 is a linear locus.

In the write time, the control part 71 receives data from the host such as a PC through the interface 72, selects the inductive head device 30, and sends data to the write modulation part 74 through the HDC 73. In response, the write modulation part 74 modulates the data, and sends the modulated data to the head IC 77. The head IC 77 amplifies the modulated data, and then supplies the data as write current to the inductive head device 30. Thereby, the inductive head device 30 writes down the data onto the target track.

In the read time, the control part 71 selects the MR head device 50, and sends the predetermined sense current to the sense-current control part 76 through the HDC 73. In response, the sense-current control part 76 supplies the sense current to the MR head device 50 through the head IC 77. This embodiment employs the CPP configuration that applies the sense current perpendicular to a direction of lamination in the MR head device 50: The instant embodiment flows higher sense current and realizes higher sensitivity in the MR change rate than those in the CIP configuration. In addition, the instant embodiment uses a laminated structure of ferromagnetic and non-magnetic layers to form the free layer and increases the number of interferences between both layers, enlarging a rate of change in magnetic resistance, and enhancing the sensitivity, in comparison with a normal spin-valve film. Therefore, the small MR head device 50 is equipped with the highly sensitivity even when it has been miniaturized in response to a bit size reduced with the higher surface recording density of the disc 13.

The MR head device 50 uses the spin-valve film 100, facilitating control over magnetic domain and reduction of hysteresis, in comparison with a multilayer GMR film. In addition, the instant embodiment arranges directions of magnetization of the separated ferromagnetic layers parallel to each other in the free layer in the MR head device 50, enhancing ease of magnetic-domain control and hysteresis control.

Data is amplified by the head IC 77 based on the electric resistance of the MR head device 50 varying according to a signal magnetic field, and then supplied to the read demodulation part 75 to be demodulated to an original signal. The demodulated signal is sent to the host (not shown) through the HDC 73, controller 71, and interface 72.

Although the preferred embodiments of the present invention have been described above, various modifications and changes may be made in the present invention without departing from the spirit and scope thereof. For example, the present invention is applicable to a magnetic sensor (such as a magnetic potentiometer for detecting a displacement and an angle, a readout of a magnetic card, a recognition of paper money printed in magnetic ink, etc.) as well as a magnetic head.

What is claimed is:

1. A magnetoresistive device comprising:

a laminated film; and a mechanism for applying sense current in a direction of lamination in said laminated film, wherein said laminated film includes:

a first ferromagnetic layer having a substantially fixed direction of magnetization;

a second ferromagnetic layer having a freely variable direction of magnetization according to an external magnetic field, said second ferromagnetic layer including a non-magnetic metal layer, and two or more ferromagnetic metal layers separated from each other by the non-magnetic metal layer in the direction of lamination; and a non-magnetic intermediate layer that separates said first and second ferromagnetic layers from each other, and wherein said two or more ferromagnetic metal layers in said second ferromagnetic layer have parallel directions of magnetization.

2. A magnetoresistive device according to claim 1, wherein the non-magnetic metal layer in said second ferromagnetic layer provides spin dependent scattering when laminated onto one of said two or more ferromagnetic metal layers in the second ferromagnetic layer.

3. A magnetoresistive device according to claim 1, wherein the non-magnetic metal layer in said second ferromagnetic layer is made of Cu.

4. A magnetoresistive device according to claim 1, wherein the non-magnetic metal layer in said second ferromagnetic layer is made of Ag.

5. A magnetoresistive device according to claim 1, wherein the non-magnetic metal layer in said second ferromagnetic layer is made of Au.

6. A magnetoresistive device according to claim 1, wherein said first ferromagnetic layer is a laminated layer that includes, in this order, a ferromagnetic metal layer, a non-magnetic metal layer, and another ferromagnetic metal layer,
wherein two ferromagnetic metal layers in said first ferromagnetic layer have antiparallel directions of magnetization via the non-magnetic metal layer in said first ferromagnetic layer.

7. A magnetoresistive device according to claim 6, wherein the ferromagnetic metal layer, the non-magnetic metal layer, and the other ferromagnetic metal layer in said first ferromagnetic layer are laminated layers made of a Co system, a Ru system, and a Co system.

8. A magnetoresistive device according to claim 1, wherein said first ferromagnetic layer, said non-magnetic intermediate layer, and said second ferromagnetic layer are laminated in this order on a substrate.

9. A magnetoresistive device according to claim 8, further comprising:
another non-magnetic intermediate layer laminated onto said second ferromagnetic layer, and
a third ferromagnetic layer that has a substantially fixed direction of magnetization and is mounted onto the other non-magnetic intermediate layer.

10. A magnetoresistive device according to claim 1, wherein said second ferromagnetic layer, said non-magnetic intermediate layer, and said first ferromagnetic layer are laminated in this order on a substrate.

11. A magnetoresistive device according to claim 1, wherein each of said two or more ferromagnetic metal layers in said second ferromagnetic layer has a thickness of 1 through 2 nm.

12. A magnetoresistive device according to claim 1, wherein said second ferromagnetic layer has a thickness of 3 through 10 nm.

13. A magnetoresistive device according to claim 1, wherein said second ferromagnetic layer has a thickness of 5 through 6 nm.

14. A magnetoresistive device according to claim 1, wherein said laminated film is a spin-valve film.

15. A magnetoresistive device according to claim 1, wherein at least one of said two or more ferromagnetic metal layers in said second ferromagnetic layer is made of CoFeB.

16. A magnetoresistive device comprising:
a laminated film; and
a mechanism for applying sense current in a direction of lamination in said laminated film,
wherein said laminated film includes:
a first ferromagnetic layer having a substantially fixed direction of magnetization;
a second ferromagnetic layer having a freely variable direction of magnetization according to an external magnetic field, said second ferromagnetic layer including a non-magnetic metal layer, and two or more ferromagnetic metal layers separated from each other by the non-magnetic metal layer in the direction of lamination; and
a non-magnetic intermediate layer that separates said first and second ferromagnetic layers from each other,
wherein said first ferromagnetic layer has a lamination of a non-magnetic part and a ferromagnetic part in the direction of lamination in said laminated film,
wherein said two or more ferromagnetic metal layers in said second ferromagnetic layer have parallel directions of magnetization.

17. A read head comprising:
a magnetoresistive device that comprises a laminated film, and a mechanism for applying sense current in a direction of lamination in said laminated film, wherein said laminated film includes a first ferromagnetic layer having a substantially fixed direction of magnetization, a second ferromagnetic layer having a freely variable direction of magnetization according to an external magnetic field, said second ferromagnetic layer including a non-magnetic metal layer, and two or more ferromagnetic metal layers separated from each other by the non-magnetic metal layer in the direction of lamination, and a non-magnetic intermediate layer that separates said first and second ferromagnetic layers from each other;
a mechanism for supplying sense current; and
a mechanism for reading a signal from changed electric resistance of said magnetoresistive device which changes according to a signal magnetic field,
wherein said two or more ferromagnetic metal layers in said second ferromagnetic layer have parallel directions of magnetization.

18. A read head comprising:
a magnetoresistive device that comprises a laminated film, and a mechanism for applying sense current in a direction of lamination in said laminated film, wherein said laminated film includes a first ferromagnetic layer having a substantially fixed direction of magnetization, a second ferromagnetic layer having a freely variable direction of magnetization according to an external magnetic field, said second ferromagnetic layer including a non-magnetic metal layer, and two or more ferromagnetic metal layers separated from each other by the non-magnetic metal layer in the direction of lamination, and a non-magnetic intermediate layer that separates said first and second ferromagnetic layers from each other, wherein said first ferromagnetic layer has a lamination of a non-magnetic part and a ferromagnetic part in the direction of lamination in said laminated film;
a mechanism for supplying sense current; and
a mechanism for reading a signal from changed electric resistance of said magnetoresistive device which changes according to a signal magnetic field,
wherein said two or more ferromagnetic metal layers in said second ferromagnetic layer have parallel directions of magnetization.

19. A drive comprising:
a read part including a read head and a write part; and
a drive part for driving a magnetic record carrier to be recorded and reproduced by said read part,
wherein said read head includes:
a magnetoresistive device that comprises a laminated film, and a mechanism for applying sense current in a direction of lamination in said laminated film, wherein said laminated film includes a first ferromagnetic layer having a substantially fixed direction of magnetization, a second ferromagnetic layer having a freely variable direction of magnetization according to an external magnetic field, said second ferromagnetic layer including a non-magnetic metal layer, and two or more ferromagnetic metal layers separated from each other by the non-magnetic metal layer in the direction of lamination, and a non-magnetic intermediate layer that separates said first and second ferromagnetic layers from each other;

a mechanism for supplying sense current; and a mechanism for reading a signal from changed electric resistance of said magnetoresistive device which changes according to a signal magnetic field, wherein said two or more ferromagnetic metal layers in said second ferromagnetic layer have parallel directions of magnetization.

20. A drive comprising:

a read part including a read head and a write part; and a drive part for driving a magnetic record carrier to be recorded and reproduced by said read part, wherein said read head includes:

a magnetoresistive device that comprises a laminated film, and a mechanism for applying sense current in a direction of lamination in said laminated film, wherein said laminated film includes a first ferromagnetic layer having a substantially fixed direction of magnetization, a second ferromagnetic layer having a freely variable direction of magnetization according to an external magnetic field, said second ferromagnetic layer including a non-magnetic metal layer, and two or more ferromagnetic metal layers separated from each other by the non-magnetic metal layer in the direction of lamination, and a non-magnetic intermediate layer that separates said first and second ferromagnetic layers from each other, wherein said first ferromagnetic layer has a lamination of a non-magnetic part and a ferromagnetic part in the direction of lamination in said laminated film;

a mechanism for supplying sense current; and a mechanism for reading a signal from changed electric resistance of said magnetoresistive device which changes according to a signal magnetic field, wherein said two or more ferromagnetic metal layers in said second ferromagnetic layer have parallel directions of magnetization.

21. A drive according to claim 19 or 20, wherein said drive is a hard disc drive and the magnetic record carrier has a surface recording density of 100 $Gb/in^2$ or higher.

* * * * *